United States Patent
Nasser-Ghodsi et al.

(10) Patent No.: US 8,202,440 B1
(45) Date of Patent: Jun. 19, 2012

(54) METHODS AND APPARATUS FOR ELECTRON BEAM ASSISTED ETCHING AT LOW TEMPERATURES

(75) Inventors: Mehran Nasser-Ghodsi, Hamilton, CA (US); Ying Wang, San Jose, CA (US); Harrison Chin, Bedford, CA (US); Anne Testoni, Holton, MA (US); R. Chris Burns, Austin, TX (US)

(73) Assignee: KLA-Tencor Corporation, Milpitas, CA (US)

( * ) Notice: Subject to any disclaimer, the term of this patent is extended or adjusted under 35 U.S.C. 154(b) by 736 days.

(21) Appl. No.: 11/670,928

(22) Filed: Feb. 2, 2007

Related U.S. Application Data

(62) Division of application No. 10/281,425, filed on Oct. 24, 2002, now abandoned.

(60) Provisional application No. 60/409,840, filed on Sep. 9, 2002, provisional application No. 60/406,939, filed on Aug. 27, 2002, provisional application No. 60/406,999, filed on Aug. 27, 2002.

(51) Int. Cl.
*C03C 15/00* (2006.01)
*C23F 1/00* (2006.01)

(52) U.S. Cl. .......... 216/63; 216/65; 216/66; 156/345.39

(58) Field of Classification Search ........................ None
See application file for complete search history.

(56) References Cited

U.S. PATENT DOCUMENTS 4,680,087 A * 7/1987 Bobbio ........................ 438/707
(Continued)

FOREIGN PATENT DOCUMENTS

JP 58110042 A2 6/1983

OTHER PUBLICATIONS

Office Action dated Jul. 27, 2004 from related U.S. Appl. No. 10/281,425.
(Continued)

*Primary Examiner* — Allan Olsen
(74) *Attorney, Agent, or Firm* — Kwan & Olynick LLP

(57) ABSTRACT

Disclosed are methods and apparatus for etching a sample, such as a semiconductor device or wafer. In general terms, embodiments of the present invention allow dry etching of a material on a sample, such as a copper material, at room temperature using a reactive substance, such as a chorine based gas. For example, the mechanisms of the present invention allow precise etching of a copper material to produce fine feature patterns without heating up the whole device or substrate to an elevated temperature such as 50° C. and above. The etching is assisted by simultaneously scanning a charged particle beam, such as an electron beam, and a photon beam, such as a laser beam, over a same target area of the sample while the reactive substance is introduced near the same target area. The reactive substance, charged particle beam, and photon beam act in combination to etch the sample at the target area. For example, a copper layer may be etched using the mechanisms of the present invention.

20 Claims, 5 Drawing Sheets

U.S. PATENT DOCUMENTS

| | | | |
|---|---|---|---|
| 4,983,540 A | | 1/1991 | Yamaguchi et al. |
| 5,004,927 A | | 4/1991 | Nakagawa |
| 5,055,696 A | | 10/1991 | Haraichi et al. |
| 5,108,543 A | * | 4/1992 | Suzuki et al. ............... 117/103 |
| 5,120,925 A | | 6/1992 | Ohnishi et al. |
| 5,182,231 A | | 1/1993 | Hongo et al. |
| 5,345,816 A | * | 9/1994 | Clabes et al. ............... 438/52 |
| 5,515,985 A | | 5/1996 | Ohshita et al. |
| 5,683,547 A | | 11/1997 | Azuma et al. |
| 6,414,307 B1 | | 7/2002 | Gerlach et al. |
| 6,492,261 B2 | | 12/2002 | Gavish et al. |
| 2001/0055649 A1 | * | 12/2001 | Ogure et al. ............... 427/248.1 |
| 2003/0102436 A1 | * | 6/2003 | Benas-Sayag et al. ....... 250/398 |
| 2004/0112863 A1 | | 6/2004 | Chen et al. |

OTHER PUBLICATIONS

Office Action dated Dec. 20, 2004 from related U.S. Appl. No. 10/281,425.

Office Action dated Apr. 5, 2005 from related U.S. Appl. No. 10/281,425.

Office Action dated Sep. 15, 2005 from related U.S. Appl. No. 10/281,425.

Office Action dated May 2, 2006 from related U.S. Appl. No. 10/281,425.

Office Action dated Nov. 7, 2006 from related U.S. Appl. No. 10/281,425.

* cited by examiner

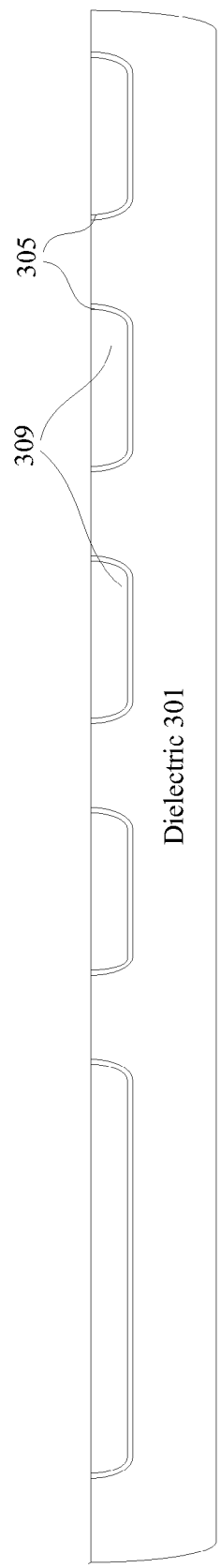
Figure 3
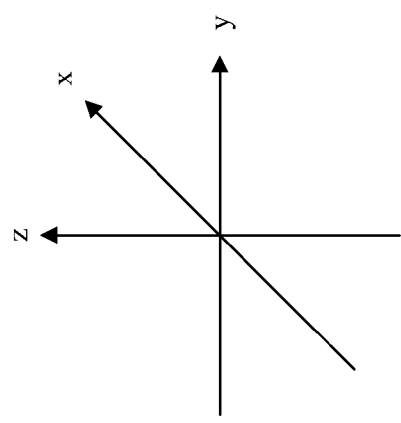

METHODS AND APPARATUS FOR ELECTRON BEAM ASSISTED ETCHING AT LOW TEMPERATURES

CROSS REFERENCE TO RELATED APPLICATIONS

This application is a divisional application and claims priority of U.S. patent application Ser. No. 10/281,425, filed 24 Oct. 2002, which claims priority of U.S. Provisional Patent Application No. 60/409,840, filed 9 Sep. 2002, U.S. Provisional Patent Application No. 60/406,939 filed 27 Aug. 2002, and U.S. Provisional Patent Application No. 60/406,999 filed 27 Aug. 2002. These applications are incorporated herein by reference in their entirety for all purposes.

BACKGROUND OF THE INVENTION

1. Field of the Invention

The present invention generally relates to the field of etching a film deposited on a sample, such as a semiconductor device. More particularly, it relates to mechanisms for dry etching at low temperatures.

2. Description of Related Art

One technique for dry etching a sample is referred to as reactive ion etching. In theory, the ions react with the surface material of the sample to form an evaporative material that thereby evaporates from the sample. However, there are problems associated with dry etching some materials, such as copper. In the case of copper, when the copper is bombarded with Cl-containing reactive gases, a copper chloride material, $CuCl_x$, is formed over the surface of the copper. This chloride material fails to evaporate well at room temperatures. Accordingly, the sample needs to be heated to temperatures that are significantly higher than room temperature to facilitate evaporation of the $CuCl_x$ material. For example, the substrate of sample must be heated to above 200° C. in order to etch Cu films. In many cases, a conventional dry etch process prevents the sample from being used in production since the high temperatures tend to damage the sample.

Consequently, improved techniques and systems for etching materials, such as Cu, to produce fine patterns at low temperature are needed. Additionally, techniques and systems for etching samples which do not destroy the sample are needed. Preferably, a dry etching mechanism that works at room temperatures for materials which cannot be conventionally dry etched at room temperatures is needed.

SUMMARY

Methods and apparatus for etching Cu on a sample, such as a semiconductor device or wafer are provided. In general terms, embodiments of the present invention allow dry etching of a material on a sample, such as a copper material, at room temperature using a reactive substance, such as a chorine based gas. For example, the mechanisms of the present invention allow precise etching of a copper material to produce fine feature patterns without heating up the whole device or substrate to an elevated temperature such as 200° C. and above. Through this process, one can operate at nominal ambient temperature of around 25° C. or less than 50° C. Of course, localized and material specific temperature may rise above 200° C. The etching is assisted by simultaneously scanning a charged particle beam, such as an electron beam, and a photon beam, such as a laser beam, over a same target area of the sample while the reactive substance is introduced near the same target area. The reactive substance, charged particle beam, and photon beam act in combination to etch the sample at the target area. For example, a copper layer may be etched using the mechanisms of the present invention.

In one embodiment, an apparatus for etching a sample is disclosed. The apparatus includes a charged particle beam generator operable to scan a first area on a sample with a charged particle beam and a photon beam generator operable to scan the first area on the sample with a photon beam. The apparatus further includes a reactive agent injector operable to introduce a reactive substance near the first area, the charged particles, and the photon beam to thereby etch a material of the sample located within the scanned first area. In a further aspect, one or more removable residual component(s) remain as a result of the interaction, and the apparatus also includes a removal mechanism operable to remove the residual component(s) of the interaction. In one implementation, the removal mechanism can be a vacuum pump. In one aspect, the residual component(s) include the reactive substance. The apparatus may also include an absorption mechanism, such as via cryogenic absorption, for preferentially absorbing at least a portion of the residual component(s). In another aspect, the apparatus further includes a movement mechanism for positioning the injector towards and away from the sample.

In a specific implementation, the charged particle beam is an electron beam. In a further aspect, the charged particle beam generator forms part of a scanning electron microscope. In one aspect, the reactive substance is a reactive gas which can etch copper in conjunction with the charged particle beam and the photon beam. In one example, the reactive substance is selected to have a high affinity for the electron beam to thereby disassociate into highly reactive elemental gases to interact with the sample and generate chorine/fluorine based salts which react with the photon beam to etch the sample. In another aspect, the etching is non-destructive to the sample (e.g., wafer) so that the sample can be used within production after the interaction. In a specific example, the sample is a semiconductor device or wafer. In another specific example, the reactive substance is a chlorine based gas. In a specific implementation, the reactive chlorine based gas is a halogen-containing gas such as $CCl_4$, $CHCl_3$, $CH_2Cl_2$, $CH_3Cl$. The halogen-containing compound may be mixed with other gases or materials, such as $H_2O$, $O_2$, $NH_3$. etc. In one embodiment, the photon beam is a laser beam and the photon beam generator is a laser source.

In another implementation, one or more operating conditions of the photon beam generator are set such that the photon beam serves as a participant in the interaction. In a further aspect, one or more operating conditions of the charged particle beam generator are set such that the charged particle beam, photon beam and the reactive substance work together to etch a substantial portion of the material of the sample located within the scanned first area or the area scanned by the electron beam. In yet a further embodiment, the one or more operating conditions of the photon and charged particle beam generators are further selected to allow etching to occur at room temperature. In another aspect, the apparatus includes a controller/processor that is operable to interleave the photon and the electron beams so that the sample is exposed to the electron beam while the photon beam is blanked off, and visa versa.

In an alternative embodiment, the invention pertains to a method of etching a sample. A first area on a sample is scanned with a charged particle beam, and the first area on the sample is also scanned with a photon beam. The photon beam scan at least partially overlaps with the charged particle beam scan. A reactive substance is introduced at the first scan target during the scans with the charged particle beam and the photon beam to thereby cause etching of a material within the first area.

In one method implementation, the introduced reactive substance is evacuated from the sample after etching completes. In a further aspect, the etching results in one or more removable residual components, and the one or more removable residual components are evacuated from the sample after etching completes. In a preferable implementation, the etching is performed at room temperature. In another implementation, the material that is etched is a copper material.

These and other features and advantages of the present invention will be presented in more detail in the following specification of the invention and the accompanying figures that illustrate by way of example various principles of the invention.

BRIEF DESCRIPTION OF THE DRAWINGS

The invention may best be understood by reference to the following description taken in conjunction with the accompanying drawings. It should be noted that the drawings are illustrative of specific embodiments of the present invention.

FIG. 3 is a cross-sectional representation showing a plurality of layers.

DESCRIPTION OF SPECIFIC EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide to a thorough understanding of the present invention. The present invention may be practiced without some or all of these specific details. In other instances, well known process operations have not been described in detail in order not to unnecessarily obscure the present invention.

Several embodiments of the present invention are described herein in the context of exemplary multilevel integrated circuit structures, including semiconductor structures and overlying metallization or other interconnects, using various levels of conductors that are separated from each other and the substrate by dielectric layers. However, structures formed using other methods of semiconductor fabrication also fall within the scope of the present invention. The techniques of the present invention apply to all surfaces with and without specific layers.

Figure 1:
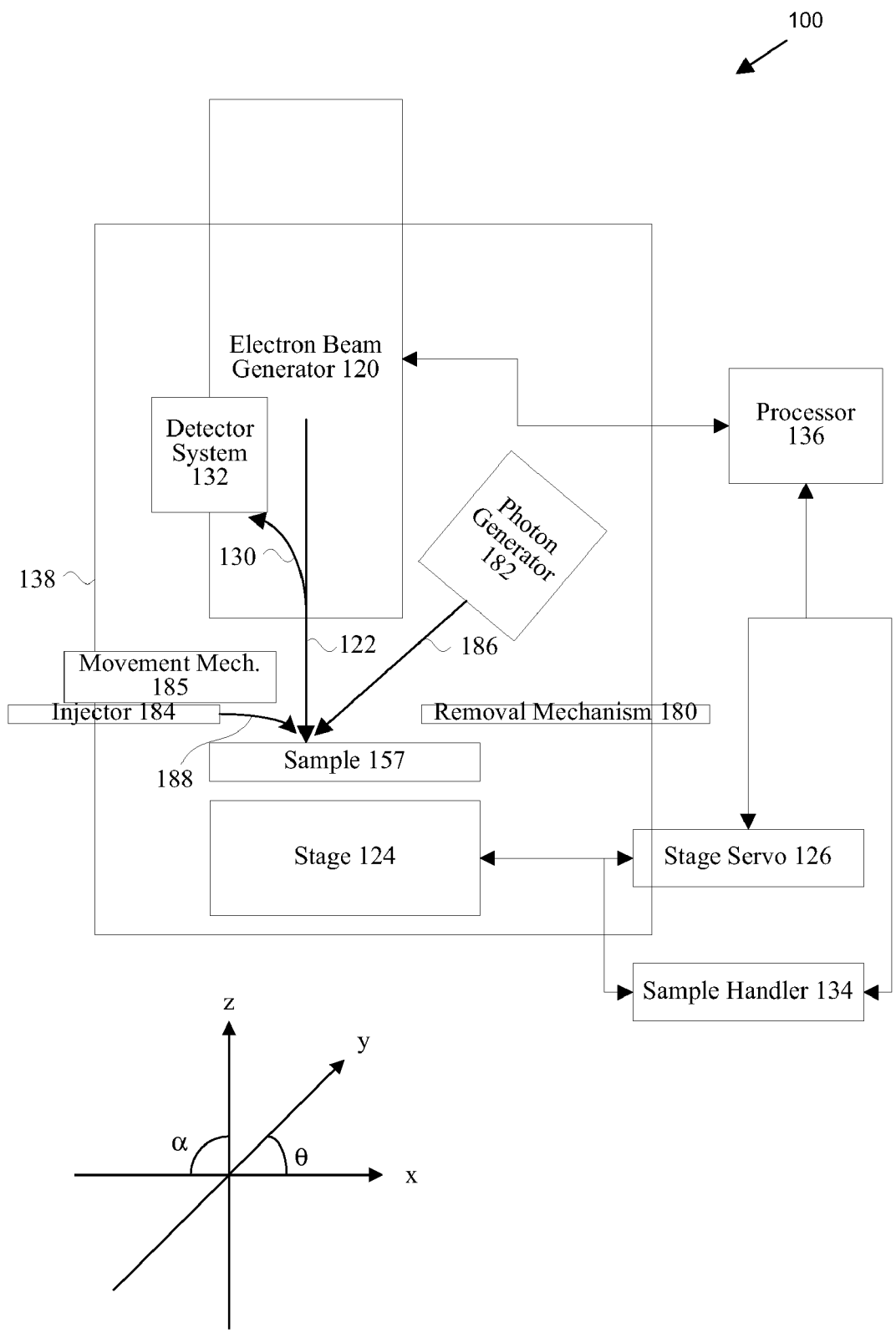
FIG. 1 is a diagrammatic representation of an electron and photon beam assisted etching system in accordance with one embodiment of the present invention.

FIG. 1 is a diagrammatic representation of an electron and photon beam assisted etching system 100 in accordance with one embodiment of the present invention. As shown, the etching system 100 includes an electron beam generator 120 for directing an electron beam 122 towards a spot or scan area on a sample 157, a reactive agent injector 184 for introducing a reactive gas 188 onto or near the same spot or scan area on the sample 157, and a photon beam generator 182 for directing a photon beam 186 towards the same spot or scan area on the sample 157. As described further below, the electron beam generator 120, reactive agent injector 184, and photon beam generator 182 work together to etch a material from the sample 157.

According to various embodiments, sample 157 is secured automatically beneath the electron beam generator 120. In the illustrated embodiment, the sample handler 134 is operable to automatically orient the sample on stage 124. In one embodiment, the stage 124 is configured to have six degrees of freedom including movement and rotation along the x-axis, y-axis, and z-axis. In one embodiment, the stage 124 is aligned relative to the electron beam generator 120 so that the x-directional motion of the stage corresponds to the axis determined by the size of a target to be etched. For example, the sample 157 can be aligned so that the x-directional movement of the stage corresponds to the length of a target as viewed from the top of the sample. Furthermore, the sample can be tilted relative to the electron beam 122 along the axis determined by the length of the target. Similarly, the sample 157 can also be aligned so that the x-directional movement of stage corresponds to the size of a target. The sample can be tilted relative to the electron beam 122 along the axis determined by the size of the target.

In one example, the stage lies on the x-y plane and the stage is tilted by varying the angle α as shown in FIG. 1. It should be noted that tilting the sample relative to the electron beam generator 120 can involve tilting the stage, moving the column, deflecting the beam with a lens, etc. It should also be noted that tilting the stage may involve varying the angle α as well as rotating the stage along angle θ. Tilting the sample is one way of allowing scanning from different directions. Where the electron beam generator 120 produces an electron beam 122, the sample can be aligned so that electrons can impinge a scan target from a wide variety of different angles, e.g., to scan within a high aspect ratio via or trench.

Fine alignment of the sample can be achieved automatically or with the assistance of a system operator through processor 136. The position and movement of stage 124 during the analysis of sample 157 can be controlled by stage servo 126. While the stage 124 is moving in the x-direction, the electron beam 122 can be repeatedly deflected back and forth in the y-direction. According to various embodiments, the electron beam 122 is moving back and forth at approximately 100 kHz. Alternatively, a relatively wide electron beam may be utilized to etch a particular area of the sample without rastering the beam relative to the sample.

Any apparatus that is capable of charged particle beam assisted etching with a reactive agent on a sample may be utilized and is herein referred to as a charged particle or electron beam generator. For instance, the system 100 may include a mechanism for generating a beam of another type of charged particles, besides electrons. One suitable embodiment of an electron beam generator is described further below with reference to FIG. 5.

The reactive agent injector 184 may take any suitable form for injecting a reactive agent onto the sample at a spot onto which an electron beam and photon beam impinge. In example implementations, the reactive agent injector 184 is in the form of needle or fine nozzle coupled with a reservoir or an injection conduit or tube. Since the chamber is kept at a vacuum pressure (e.g., with a vacuum pump), a reactive substance flows from the reservoir, into a first end of the injection tube, and escapes out of a second end of the injection tube onto the sample. In other example implementations, the reactive agent injector 184 is formed from a mixing of various gases coming from different gas transportation conduits. The reactive agent injector is positioned so that it can effectively inject the reactive substance onto a selected spot or target area of the sample. In one embodiment, the reactive agent injector 184 is arranged within a distance that is less than about 2 mm from the sample 157 to introduce reactive gas 188 onto the sample surface. A movement mechanism 185 may be utilized to movably position the injector 184 near the sample 157. The movement mechanism may take any suitable form for moving the injector 184 towards and away from the sample 157. For example, the movement mechanisms 185 may include an actuator and translational motor in the form of, among others, a screw drive and stepper motor, linear drive with feedback position, or band actuator and stepper motor. The movement mechanism 185 may also position the injector 184 away from the sample when the injector 184 is not in use.

With the presence of reactive substance and photon beam, the charged particles 122 can etch away the material at the scan target. The reactive gas 188 may be any suitable gas or fluid which acts to etch away a particular target material with the assistance of a charged particle beam. For instance, the reactive agent or gas 188 may be selected to have a high affinity for the electron beam to thereby disassociate into highly reactive elemental gases to interact with the sample and generate chorine/fluorine based "salts" which in turn react with the photon beam. In various semiconductor applications, the reactive gas may be a chlorine based gas, a fluorine based gas, a bromide based gas, a halogen based gas, a halogen-containing gas or a mixture of halogen-containing gas and other gases. By way of examples, the reactive gas is a halogen-containing gas such as $CCl_4$, $CHCl_3$, $CH_2Cl_2$, $CH_3Cl$. The halogen-containing compound may be mixed with other gases or materials, such as $H_2O$, $O_2$, $NH_3$. etc. The interaction leaves one or more residual components. In one embodiment, the reactive gas is $CF_4$ contains $CCl_4$, which breaks up into atoms, radicals and ions carbon and fluorine to interact with the sample to produce a chemical (or chemicals) that has an appropriate pressure for evacuation by a pumping system.

In sum, the reactive substance (e.g., gas) together with the electron and photon beam interact with a material on the sample to produce one or more residual components. According to various embodiments, the residual components, which also include the injected reactive substance, are removed by using a residual component removal mechanism 180. In one embodiment, the residual component removal mechanism 180 includes a conduit with a first end within the chamber and a second end outside the chamber and a pump coupled to the conduit for evacuating residual components from the chamber through the conduit into a reservoir, for example.

The photon beam generator 182 generates a photon beam 122 for facilitating the interaction between the electron beam 122, reactive gas 188, and surface material of the sample 157 to thereby more quickly etch away the surface material, as compared to an charged particle beam etching process that does not use a photon beam generator. In general, the photon beam generator 182 may induce a chemical and/or physical effect with respect to the interaction between the electron beam 122, reactive gas 188, and surface material of sample 157. The photon beam 186 can generate surface heating and induce photochemical reaction on the surface of target area. The photon beam generator 182 may generate any suitable type of light beam to assist the charged particle induced etching. The type of light used depends on the type of material to be etched, the charged particle beam properties used, and the type of reactive agents being introduced. A laser beam having a wavelength in the infrared region (for example, 1064 nm) or the region between 250 and 350 nm works well in the application of etching copper materials. By way of examples, the photon beam generator may be in the form of a laser source, such as a 308 nm laser, or a broadband light source, such as an infrared (IR) lamp.

The system 100 of FIG. 1 allows etching of materials at room temperature that cannot otherwise be etched at room temperatures using conventional etching techniques, such as reactive ion etching. For example, one may use the system 100 of FIG. 1 to effectively dry etch copper at ambient temperatures below 50° C. In other words, the sample does not have to be heated to temperatures over 200° C. to thereby induce etching as in conventional etching systems. Of course, localized and material specific temperature may rise above 200° C., while the system ambient temperature remains below 50° C. Since only the target area of sample is being etched with a reactive substance, a charged particle beam, and a photon beam at room temperature and since there is no Ga contamination which is present in focused ion beam cross-sectioning, the other areas of sample is not destroyed during the etching process and may be used in production.

According to various embodiments, the system 100 includes a secondary electron emission detector 132 aligned alongside the electron beam generator 120. The detector 132 detects secondary electrons 130 emitted from the sample in response to the incident beam 122. However, a detector 132 is optional during an etching application.

The electron beam generator 120 and detector 132 as well as other elements such as the photon beam generator 182, the residual component removal mechanism 180, and the reactive agent injector 184 can be controlled using a variety of processors, storage elements, and input and output devices (e.g., processor 136).

As shown, the sample 157, stage 124, electron beam generator 120, detector 132, and photon generator 182 are enclosed within a vacuum chamber 138. The injector 184 and removal mechanism 180 are shown as being partially within and partially outside the vacuum chamber 138. The photon generator 182 may alternatively be located completely or partially outside the chamber 138 wherein a light carrier, such as a fiber optical cable, directs the photon beam 186 into the chamber 138 and onto the sample 157. The injector 184 and removal mechanism 180 may alternatively be located completely within the chamber 138. For example, the injector mechanism may include a conduit and reservoir located completely within the chamber 138.

One skilled in the art would understand that variations to the system 100 shown in FIG. 1 fall within the scope of the present invention. For example, FIG. 1 shows the utilization of an electron beam with a continuously moving stage. However, any suitable type of charged particle beam may be used. As an alternative to moving the stage with respect to the electron beam, the electron beam may be moved by deflecting the field of view with an electromagnetic lens. Alternatively, the electron beam column can be moved with respect to the stage.

Figure 2:
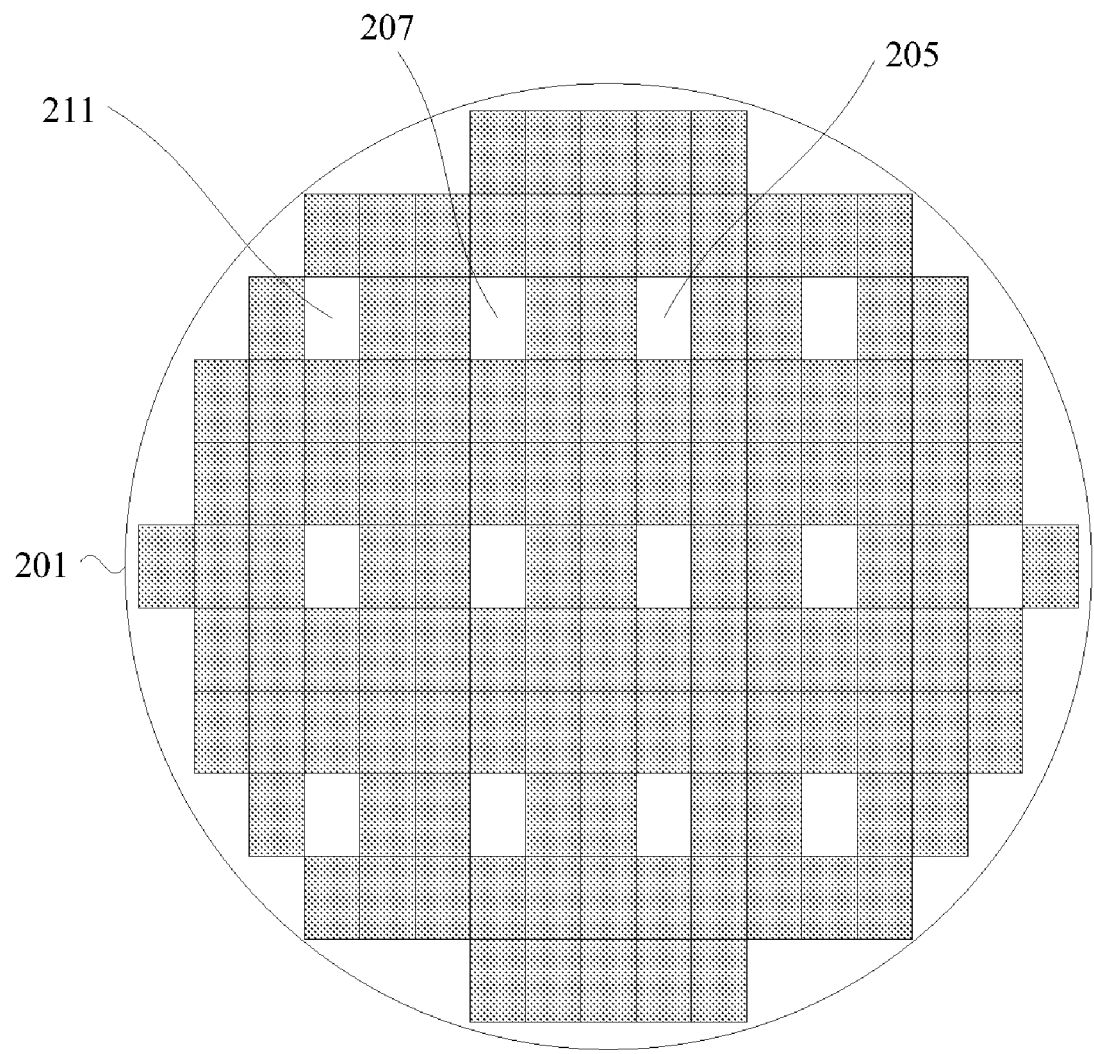
FIG. 2 is a diagrammatic representation of a wafer that may be the sample under test.

FIG. 2 is a diagrammatic representation of a wafer that may be a sample under test. A wafer 201 comprises a plurality of die 205, 207, and 211. According to various embodiments, a sample is etched after a metallization or thin film layer is deposited onto a wafer. The side of the wafer where the metallization process is performed is herein referred to as the top surface of the wafer.

FIG. 3 is a diagrammatic representation of a cross-section of a test sample. The techniques of the present invention can be used to etch any suitable layer of the sample for various purposes. In one example, a resist layer can be etched in order to examine the materials beneath the resist layer. In another example, a substrate is etched to inspect a structures underneath the substrate. In still another example, the metallization or thin film layer 309 on top of a barrier layer 305 is etched down to the underlying barrier layer. According to various embodiments, the thin film layer 309 comprises a material such as copper (Cu) or aluminum (Al) and the barrier layer comprises a material such as tantalum (Ta) or tantalum nitride (TaN). The electron beam and photon beam assisted etching system and techniques of the present invention are especially useful for materials which cannot be affectively dry etched at room temperature, such as Cu.

Figure 4:
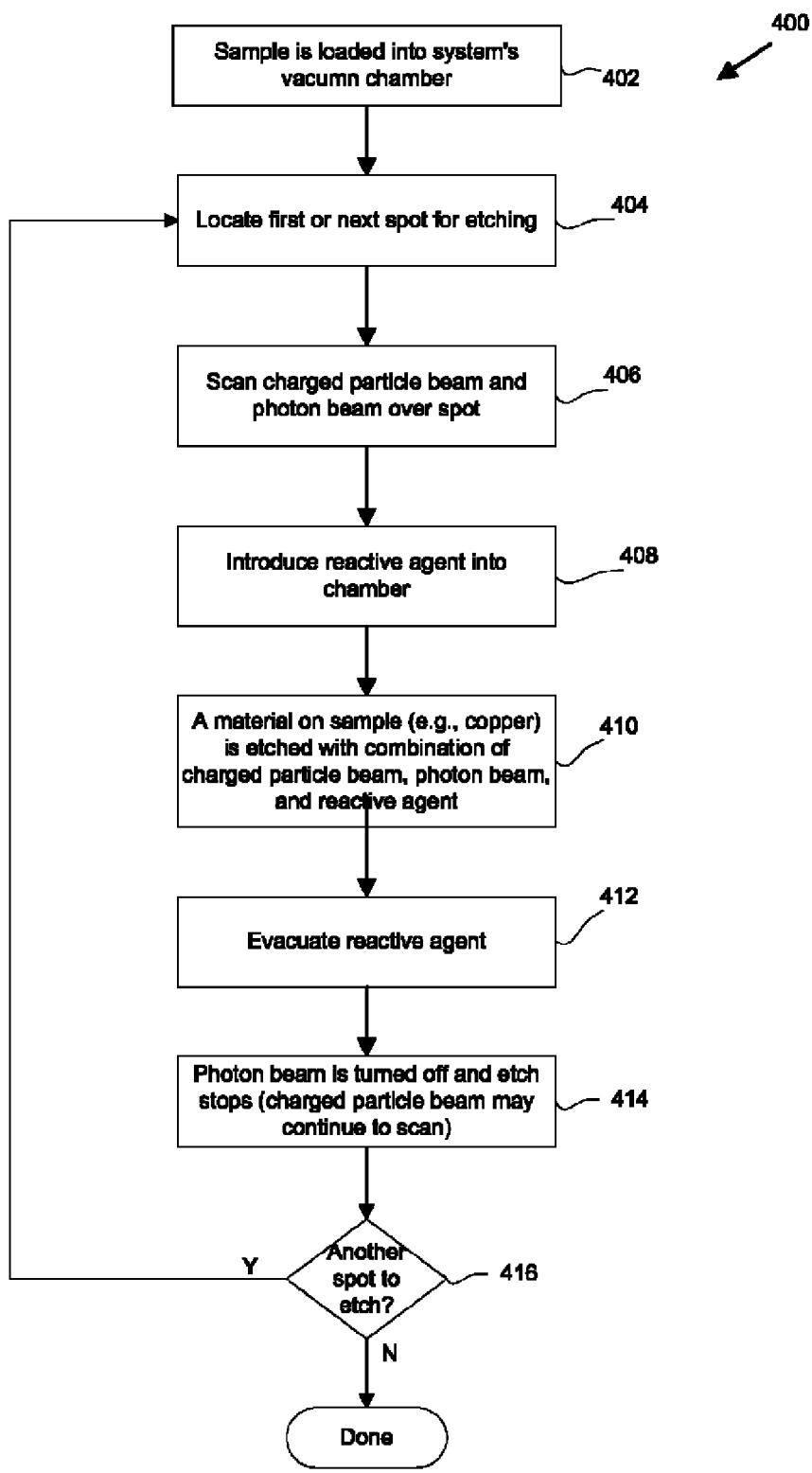
FIG. 4 is a flow chart illustrating a procedure for etching a surface material from a sample with an electron beam, photon beam, and reactive agent in accordance with one embodiment of the present invention.

Any suitable etching technique may be implemented to attain a charged particle and photon beam assisted etch process. FIG. 4 is a flow chart illustrating a procedure 400 for etching a surface material from a sample with an electron beam, photon beam, and reactive agent in accordance with one embodiment of the present invention. Initially, a sample is placed within the vacuum chamber (e.g., 138) in operation 402. Next, a first spot is located on the sample in operation 404. Any suitable mechanism may be used to locate a spot for etching. For example, the sample may correspond to a design file which contains particular design layers which correspond to etch areas. An etch area is found by finding a spot on the sample which corresponds to one of these etch areas within the design file. Alternatively, the sample may need to be etched uniformly. In this case, spots may be sequentially selected on the sample so that the entire surface area of the sample is sequentially etched.

After a first spot is selected, a charged particle beam, such as an electron beam, and a photon beam, such as a laser beam, are both scanned substantially simultaneously over the selected spot in operation 406. In other words, there is a time period when the two beams are both scanning over the selected spot. In one embodiment, the charged particle and photon beams are both configured to move over the target spot in a y direction, while the stage is configured to move the sample and its target spot under the beams in an x direction, or visa versa. This combination of these two movements result in a raster scan pattern. However, any suitable scan pattern may be implemented to etch a spot or area on the sample.

While the charged particle and photon beams scan over the same first spot, a reactive agent is introduced into the chamber (e.g., 138) in operation 408. A material located within the scanned target spot, e.g., copper, is then etched by the combination of the reactive agent and the charged particle and photon beams in operation 410. The charged particle beam and photon beams may be configured in any suitable manner that results in an etching of the surface material. In one implementation, operating conditions are selected for the charged particle beam and photon beam generators for a particular surface material on a test sample. The operating conditions include various system parameters, such as landing energy and intensity of the charged particle beam, a scan pattern or frequency of the charged particle beam, a frequency and power of the photon beam (laser or broadband light source; for laser, it can be continuous or pulse laser; for pulse laser, the duration of pulse and pulse repetition rate may also be optimized), the incident angle of photon beam, a scan pattern of the photon beam, an etch time, the injection rate of reactive substance, the beam spot size of charge particle and photon beam.

The sample is inspected after the selected etch time expires and the etching stops. If the surface material is not etched down to the underlying substrate or the surface material as well as a significant portion of the substrate is etched away, the operating conditions and/or etch time may be adjusted. If the surface material is etched away and a significant portion of the substrate is not etched away, the current operating conditions are optimized and may then be used to etch other similar surface materials on other samples. This calibration process may have to be repeated for different types of material compositions and thickness values.

An endpoint for the etching process may be detected by any suitable technique. For example, an etch time may be selected for etching away a particular thin film composition and thickness. After the etch time expires, the etching stops. That is, the reactive agent is evacuated form the chamber in operation 412, and the photon beam is turned off in operation 414. The charged particle beam may continue to scan across the sample. Alternatively, it may also be turned off.

It is then determined whether another spot needs to be etched in operation 416. If another spot requires etching, a next spot is located in operation 404 and the etching procedure 400 continues to thereby etch the next spot in operations 406 through 414. When there are no longer any spots that require etching, the etching procedure 400 then ends.

It should be noted that the present application's reference to a particular singular entity includes plural entities, unless the context clearly dictates otherwise. Here, for example, multiple residual components may remain for evacuation by a pumping system. Any remnant of an interaction between a reactive substance, an electron beam, and a scan target is referred to herein as a residual component. It should also be noted that although the above example has been described in the context of etching relating to a copper material, a variety of materials and layers can be removed using the techniques of the present invention. In one example, a resist layer is removed using a different reactive substance.

The charged particle beam generator 120 of FIG. 1 may take any form which provides charged particle beam assisted etching. In one embodiment, charged particle beam generator 120 forms part of a scanning electron microscope (SEM). FIG. 6 is a diagrammatic representation of a scanning electron microscope (SEM) 600 in accordance with one embodiment of the present invention. As shown, the SEM system 500 includes an electron beam generator (502 through 516) that generates and directs an electron beam 501 substantially toward an area of interest on a specimen 524. The SEM system 500 may also include a detector 526 arranged to detect charged particles 205 (secondary electrons and/or backscattered electrons) emitted from the sample 524. The SEM may also include an image generator (not shown) for forming an image from the emitted particles.

The electron beam generator may be arranged in any suitable configuration for generating an electron beam that will result in secondary electrons being emitted from the sample 524. In one embodiment, the electron beam generator can include an electron source unit 502, an alignment octupole 506, an electrostatic predeflector 508, a variable aperture 510, a wien filter 514, and a magnetic objective lens 516. The source unit 502 may be implemented in any suitable form for generating and emitting electrons. For example, the source unit 502 may be in the form of a filament that is heated such that electrons within the filament are excited and emitted from the filament. The octupole 506 is configured to align the beam after a particular gun lens voltage is selected. In other words, the beam may have to be moved such that it is realigned with respect to the aperture 510.

The aperture 510 forms a hole through which the beam is directed. The lower quadrupole 508 may be included to compensate for mechanical alignment discrepancies. That is, the lower quadrupole 508 is used to adjust the alignment of the beam with respect to any misaligned through-holes of the SEM through which the beam must travel.

The Wien filter 514 provides a B×E field (e.g., a magnetic field's direction is perpendicular and directed away from a direction of an electric field) that is normal to the electron beam is path. The Wien filter 514 applies an E force on the beam that is opposite to the B force that is applied on the beam. Thus, the Wien filter does not substantially move the beam off axis. However, the Wien filter 514 applies the E force and B force on secondary electrons emitted from the sample in a same direction that is towards the detector 526. Thus, the Wien filter 514 deflects secondary electrons towards the detector 526. The Wien filter 514 and/or octopole 506 and/or quadrapole 508 may be configured to direct the beam across an area of the sample. By setting the X and Y scan voltages, a particular beam pattern may be selected. The deflection system may include a processor that may be also configured to control voltage settings on the electrodes, as well as scan voltages, as a function of incident beam position.

The magnetic objective lens 516 provides a mechanism for fine focusing of the beam on the sample. A plurality of electrostatic lens (not shown) may provide fast focus of the beam onto the sample surface. The SEM system 500 may include a support or stage (not shown) for supporting the sample 524.

The SEM system 500 may include a detector 526 for generating a detected signal from the detected secondary and/or backscattered electrons, or alternatively X-rays emitted from the sample in response to the electron beam. The detector may take the form of a micro-channel plate, micro-sphere plate, semiconductor diode, a scintillator/photomultiplier (PMT) assembly, an Energy Dispersive System (EDS), or a wavelength dispersive system (WDS) detector.

The SEM system 500 may also include an image generator (not shown) arranged to receive the detected signal and generate and/or store an image. The image generator is operable to generate an image based on the detected signal. Thus, the SEM system 500 may also include an analog to digital converter for converting the detected signal into a digital signal. The SEM system 500 may also include a computer system for processing the image frame data to generate an image of the sample. For example, successive image frame data may be averaged together to create the image.

Figure 5:
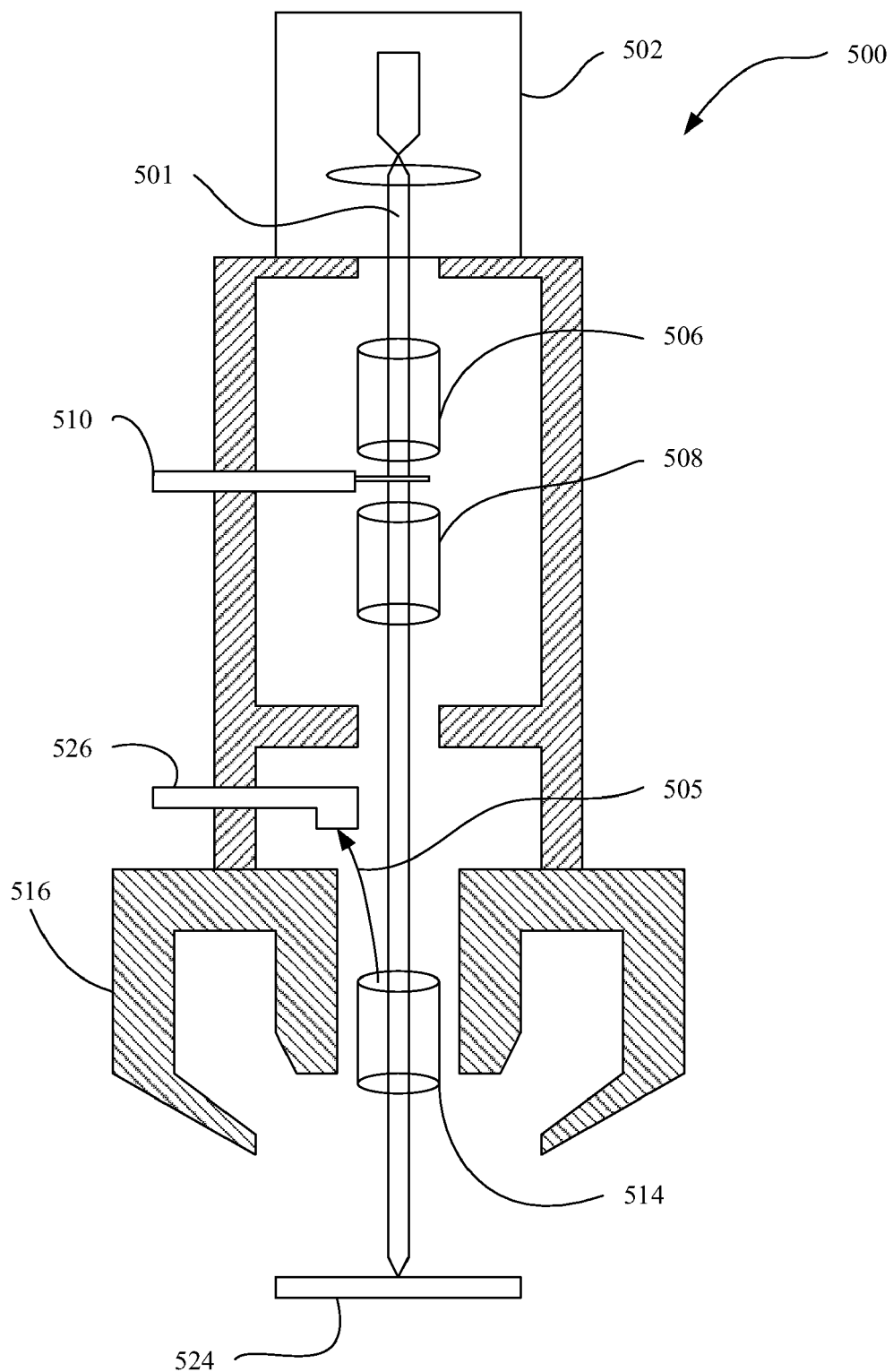
FIG. 5 is a diagrammatic representation of a particle beam that can be used to implement scanning of a sample.

Although the invention has been described as being implemented on the SEM system 500 of FIG. 5, of course, another SEM system may be implemented. By way of example, the source may expel electrons at an eV that is substantially equal to the final landing energy value, and the electrons are then accelerated through a series of lens that are set at large positive potentials. As the electrons are expelled from the series of lens, the electrons then slow down and hit the sample at the final landing energy. The series of lenses may throw out a large extraction field out of the objective lens, which acts to decelerate the electron beam, while accelerating the secondary electrons that are emitted from the sample.

Although the foregoing invention has been described in some detail for purposes of clarity of understanding, it will be apparent that certain changes and modifications may be practiced within the scope of the appended claims. It should be noted that there are many alternative ways of implementing the techniques of the present invention. For example, the sample may be any substance or object that is suitable for charged particle and photon beam assisted etching, such as a semiconductor wafer. In another alternative implementation, the electron beam may be interleaved with the photon beam (e.g., via the processor 136). That is, the sample is exposed to the photon beam while the electron beam is blanked off, and visa versa. Additionally, the present invention may be especially useful in etching thin film heads within hard disks, which are being designed with smaller and smaller dimensions. The etching system (e.g., 100) may include an absorption mechanism for accelerated evacuation of the residual components (e.g., via a cryogenic process). Accordingly, the present embodiments are to be considered as illustrative and not restrictive, and the invention is not to be limited to the details given herein, but may be modified within the scope and equivalents of the appended claims.

What is claimed is:

1. A method of etching a sample, the method comprising:
   directing a charged particle beam towards an area on a sample;
   directing a photon beam towards an area on the sample, wherein the area on which the photon beam impinges overlaps with at least a portion of the area on which the charged particle beam impinges; and
   while the charged particle beam and the photon beam impinge on the overlapping area, introducing a reactive substance at the overlapping area along with directing the charged particle beam and the photon beam, wherein the active substance, charged particle beam and photon beam act in combination to etch a material within the overlapping area while a system ambient temperature remains below about 50° C.

2. A method as recited in claim 1, wherein the etching is performed at room temperature.

3. A method as recited in claim 1, wherein the material that is etched is a material other than a copper material.

4. A method as recited in claim 1, wherein the etching is performed without heating the entire sample.

5. A method as recited in claim 1, wherein the etching is performed at a temperature between about 25° C. and about 50° C.

6. A method as recited in claim 1, wherein the charged particular beam is an electron beam.

7. A method as recited in claim 1, wherein the reactive substance is a reactive gas which can etch copper in conjunction with the charged particle beam and photon beam.

8. A method as recited in claim 1, wherein the etching is non-destructive to the sample whereby the sample can be used for further sample processing after the etching.

9. A method as recited in claim 1, wherein the reactive substance is a reactive fluorine based gas is $CF_4$.

10. A method as recited in claim 1, wherein the reactive substance forms chlorine-containing mixture.

11. A method as recited in claim 1, further comprising evacuating the introduced reactive substance from the sample after etching completes.

12. A method as recited in claim 11, wherein the etching results in one or more removable residual components, and the method further comprising evacuating the one or more removable residual components from the sample after etching completes.

13. A method as recited in claim 1, wherein the material that is etched is a copper material.

14. A method as recited in claim 13, wherein the photon beam has a wavelength between 250 and 350 nm for etching the copper material.

15. A method as recited in claim 1, wherein the reactive substance is a chlorine based gas, a fluorine based gas, a bromide based gas, a halogen-containing gas, or a mixture of halogen-containing gas and other gases.

16. A method as recited in claim 15, wherein the reactive substance is a halogen-containing gas.

17. A method as recited in claim 1, wherein the reactive substance includes $CCl_4$, $CHCl_3$, $CH_2Cl_2$, or $CH_3Cl$.

18. A method as recited in claim 16, wherein the halogen-containing gas is mixed with other gases or materials.

19. A method as recited in claim 1, wherein the photon beam is a laser beam that has a wavelength range for facilitating etching.

20. A method as recited in claim 19, wherein the wavelength is in the infrared region.

* * * * *